US008900908B2

(12) United States Patent
Suwito et al.

(10) Patent No.: US 8,900,908 B2
(45) Date of Patent: Dec. 2, 2014

(54) METHOD FOR LOCAL HIGH-DOPING AND CONTACTING OF A SEMICONDUCTOR STRUCTURE WHICH COMPRISES A SOLAR CELL OR A PRECURSOR OF A SOLAR CELL

(75) Inventors: Dominik Suwito, Santa-Clara, CA (US); Jan Benick, Freiburg (DE); Ulrich Jager, Freiburg (DE)

(73) Assignees: Fraunhofer-Gesellschaft zur Förderung der Angewandten Forschung E.V., München (DE); Albert-Ludwigs-Universität Freiburg, Freiburg (DE)

( * ) Notice: Subject to any disclaimer, the term of this patent is extended or adjusted under 35 U.S.C. 154(b) by 309 days.

(21) Appl. No.: 13/575,446

(22) PCT Filed: Jan. 18, 2011

(86) PCT No.: PCT/EP2011/000180
§ 371 (c)(1),
(2), (4) Date: Jul. 26, 2012

(87) PCT Pub. No.: WO2011/091959
PCT Pub. Date: Aug. 4, 2011

(65) Prior Publication Data
US 2012/0301995 A1    Nov. 29, 2012

(30) Foreign Application Priority Data
Jan. 29, 2010    (DE) .......................... 10 2010 006 315

(51) Int. Cl.
*H01L 21/00* (2006.01)
*H01L 31/061* (2012.01)
*H01L 31/0216* (2014.01)
*H01L 31/18* (2006.01)
*H01L 31/0224* (2006.01)
*H01L 21/268* (2006.01)

(52) U.S. Cl.
CPC .......... *H01L 31/1804* (2013.01); *H01L 21/268* (2013.01); *H01L 31/061* (2013.01); *H01L 31/02168* (2013.01); *Y02E 10/547* (2013.01); *H01L 31/022425* (2013.01)
USPC .............. 438/57; 257/E27.124; 257/E25.007; 257/E25.009; 136/261; 136/246

(58) Field of Classification Search
USPC ........ 438/57, 69, 71, 542, 550; 257/E27.124, 257/E25.007, E25.009; 136/246, 261
See application file for complete search history.

(56) References Cited

U.S. PATENT DOCUMENTS

2009/0061627 A1    3/2009    Trassl et al.
2010/0206371 A1    8/2010    Janz et al.

FOREIGN PATENT DOCUMENTS

DE    10046170    4/2002
EP    1187223    3/2002
EP    1993143    11/2008

OTHER PUBLICATIONS

Janz S. et al. "Amorphous Sic: Applications for Silicon Solar Cells", 21st European Photovoltaic Solar Energy Conference, Sep. 4-8, 2006, Dresden, Germany, pp. 660-663.
Suwito D. et al. "The Influence of Annealing on the Passivation Quality of A-SiCX:H on Crystalline Silicon and Germanium Surfaces", Photovoltaic Specialists Conference, 2009 34th IEEE, Piscataway, NJ, Jun. 7, 2009, pp. 700-704.
Suwito D. et al. "Industrially Feasible Rear Passivation and Contacting Scheme for High-Efficiency n-Type Solar Cells Yielding a Voc of 700 mV", IEEE Transactions on Electron Devices, vol. 57, No. 8, Aug. 2010, pp. 2032-2036.
Glunz, S.W., et al. "Laser-Fired Contact Silicon Solar Cells on p- and n-Substrates", 19th European Photovoltaic Solar Energy Conference, Jun. 7-11, 2004, Paris, pp. 1-4.
Schneiderlochner, E. et al. "Laser-Fired Rear Contacts for Crystalline Silicon Solar Cells", Progress in Photovoltaics: Research and Applications, Prog. Photovolt: Res. Appl. 2002; 10:29-34 (DOI: 10.1002/pip. 422), pp. 29-34.
Taguchi et al. "High-Efficiency Hit Solar Cell on Thin (<100 μm) Silicon Wafer", 24th European Photovoltaic Solar Energy Conference (Hamburg, Germany), 2009.

(56) References Cited

OTHER PUBLICATIONS

Benick, J. et al. "High-efficiency n-type silicon solar cells with front side boron emitter", in Proceedings of the 24th European Photovoltaic Solar Energy Conference (Hamburg, Germany), 2009.

*Primary Examiner* — David Vu
(74) *Attorney, Agent, or Firm* — Volpe and Koenig, P.C.

(57) ABSTRACT

The invention relates to a method for local high-doping and contacting of a semiconductor structure which is a solar cell or a precursor of a solar cell and has a silicon semiconductor substrate (1) of a base doping type. The high-doping and contacting is effected by producing a plurality of local high-doping regions of the base doping type in the semiconductor substrate (1) on a contacting side (1*a*) of the semiconductor substrate and applying a metal contacting layer (7) to the contacting side (1*a*) or, if applicable, one or more intermediate layers wholly or partially covering the contacting side (1*a*), to form electrically conductive connections between the metal contacting layer (7) and the semiconductor substrate (1) at the high doping regions. It is important that the method comprises the following steps: A) producing a layer structure covering the contacting side (1 *a*) of the semiconductor substrate, comprising a doping layer (3), which contains a dopant of the base doping type and is in the form of a layer of amorphous silicon or a layer of amorphous silicon carbide having a carbon content less than 10 at. % and a reflective layer (4), which at least in the wavelength range between 800 nm and 1200 nm is constructed with a refractive index $n_R$ smaller than the refractive index $n_{Hs}$ of the semiconductor substrate, wherein the doping layer (3) lying in the layer sequence closer to the contacting side (1 *a*) is constructed as the reflective layer (4); B) local heating of layer structure and the surface lying thereunder of the semiconductor substrate at a plurality of zones to form local high-doping regions, wherein the local heating is effected such that at each of the locally heated regions a melt mixture of at least the doping layer (3) and a portion of the semiconductor substrate is formed locally on the contacting side (1 *a*), and on solidification of the melt mixture a high doping region (6) more strongly doped by at least the dopant of the doping layer (3) is formed in the semiconductor substrate (1) on the contacting side (1 *a*), and applying a metal contacting layer (7) to form an electrically conductive connection between semiconductor substrate (1) and contacting layer (7) at the high-doping regions.

15 Claims, 2 Drawing Sheets

METHOD FOR LOCAL HIGH-DOPING AND CONTACTING OF A SEMICONDUCTOR STRUCTURE WHICH COMPRISES A SOLAR CELL OR A PRECURSOR OF A SOLAR CELL

BACKGROUND

The invention relates to a method for a local high-doping and contacting of a semiconductor structure, which represents a solar cell or a precursor of a solar cell and comprises a semiconductor substrate of a base doping type.

In photo-voltaic solar cells, based on a silicon semiconductor substrate, a plurality of approaches have been undertaken to achieve high effectiveness in the conversion of incident electromagnetic radiation into electric energy, on the one hand, and cost-effective industrial production, on the other hand. In particular, in solar cells in which an emitter and thus also a pn-junction separating the generated pairs of charge carriers or in the area of the front of the solar cell embodied for incident light typically the electric contacting of the base occurs via a metallic contacting layer arranged at the rear, which is connected in an electrically conductive fashion to the semiconductor substrate. Here, it is essential for yielding high effectiveness that the rear is effectively passivated, i.e. a low surface recombination velocity is achieved for the minority charge carriers, particularly in the area of the rear surface of the semiconductor substrate, as well as a contacting with low contact resistance.

For example, solar cell structures are known in which the rear of the semiconductor substrate is essentially covered entirely with a silicon nitride or silicon dioxide layer such that low surface recombination velocities are yielded. Only at contact points the passivating layer is punctually open and an electrically conductive connection to a metallic contacting layer is given. An increase in effectiveness is achieved by a local high-doping in the area of the contact points, because due to the local high-doping a reduction of the rear recombination and additionally a reduction of the contact resistance are yielded between the metallic contacting layer and the semiconductor substrate. An example for such a solar cell structure is the PERL-structure (passivated emitter, rear locally defused), as described in J. Benick, B. Hoex, G. Dingemans, A. Richer, M. Hermle, and S. W. Glunz "High-efficiency n-type silicon solar cells with front side boron emitter", in Proceedings of the 24th European Photovoltaic Solar Energy Conference (Hamburg, Germany), 2009. This structure, which allows a rear contacting to yield high effectiveness, requires for its production, in addition to the supplementary diffusion to yield the high-doping areas, some additional photo-lithographic steps, so that an industrial implementation of this solar cell—structure is not practicable or at least very cost intensive.

A solar cell structure with low recombination velocities at the rear could be realized by the HIT-structure, which compared to the PERL-structure allows an easier industrial implementation. The HIT-structure is described in EP 1 187 223 A2 and M. Taguchi, Y. Tsunomura, H. Inoue, S. Taira, T. Nakashima, T. Baba, H. Sakata, and E. Maruyama, "High-efficiency HIT solar cell on thin (<100 µm) silicon wafer," in Proceedings of the 24th European Photovoltaic Solar Energy Conference (Hamburg, Germany), 2009. At the rear of a HIT-solar cell a hetero-junction is formed by a layer structure being applied to the rear of the silicon semiconductor substrate, comprising a thin intrinsic layer comprising amorphous silicon, a thin doped layer of amorphous silicon, and a transparent, conductive oxide. The layer of intrinsic amorphous silicon ensures a highly efficient passivation of the rear and thus low recombination velocities for the minority charge carriers. However, simultaneously this layer must be sufficiently thin to allow a charge carrier traveling via tunnel processes into the doped layer located thereabove comprising amorphous silicon. This leads to the requirement for the layer thickness and the quality of the amorphous silicon layers to be very high, particularly regarding the precision during the application process of the layers with regards to the layer thickness and also the material quality. High effectiveness can be achieved with this solar cell concept only if these high requirements are ensured.

SUMMARY

The invention is therefore based on the objective to provide a method for a local high-doping and contacting of a semiconductor structure, which comprises a solar cell or a precursor of a solar cell and a silicon semiconductor substrate of a base doping type. The method shall provide a local high-doping and contacting of the semiconductor structure, which allows the production of a solar cell with high effectiveness and can further be implemented in a technically inexpensive fashion compared to methods of prior art and thus in an industrial scope and cost-effectively.

This objective is attained in a method according to the invention. Advantageous embodiments of the method are disclosed below.

The method according to the invention serves for the locally high-doping and contacting of a semiconductor structure, representing a solar cell or a precursor of a solar cell. The semiconductor structure comprises a silicon semiconductor substrate of a base doping type. Doping types are here the n-doping type or the p-doping type opposite thereto. The method according to the invention can be used for solar cells with both the n-doped as well as the p-doped base.

The high doping and contacting occurs by creating several high-doping areas of the base doping type in the semiconductor substrate at a contacting side of the semiconductor substrate and applying a metallic contacting layer on the contacting side or, if applicable, one or more intermediate layers covering the contacting side partially or entirely such that electrically conductive connections are formed between the metallic contacting layer and the semiconductor substrate at the high-doping areas.

It is essential that the method according to the invention comprises the following processing steps:

In a processing step A, a contacting side of the semiconductor substrate is produced covering the layer structure. The layer structure comprises a doping layer, which includes a doping substance of the base doping type. The doping layer is formed as a layer comprising amorphous silicon or as a layer comprising amorphous silicon carbide with a carbon content of less than 10 atom percent (at %). Thus, silicon is an essential component of the amorphous doping layer as well as the doping substance of the base doping type and perhaps carbon.

The statements of the atom percent always relate here and in the following, as common in the field, to a reference atomic density (100 at %) of crystalline silicon, because the precise atomic density of the precipitated layers is unknown.

The layer structure further comprises a reflective layer. The reflective layer is embodied such that it exhibits a diffraction index $n_R$ lower than the diffraction index $n_{HS}$ of the semiconductor substrate at a wavelength range from 800 nm to 1200 nm.

Starting at the contacting side of the semiconductor substrate the doping layer follows in the layer sequence before the reflective layer.

In a processing step B a local heating of the layer structure and the surface of the semiconductor substrate located thereunder occurs at several zones to form local high-doping areas. The local heating occurs such that at the zones of the local heating locally respectively one molten mixture develops comprising at least the doping layer of the layer structure and a partial area of the semiconductor substrate at the contact side. During the cooling and curing process of the molten mixture a high-doping area develops in the semiconductor substrate at the contacting site, higher doped than the base doping of the semiconductor substrate, at least by the doping substance of the doping layer.

In a processing step C a metallic contacting layer is applied to form an electrically conductive connection between the semiconductor substrate and the contacting layer at the high-doping areas.

The local high-doping produced by the method according to the invention and the contacting therefore show the advantages that by the application of the layer structure at the contacting side an electric passivation of the contacting side of the semiconductor substrate occurs and thus a reduction of the surface recombination velocity is already yielded at the contacting side. Furthermore, by the local melting, among other things of the doping layer, a local high-doping of the semiconductor substrate occurs at several areas, with the electric contacting occurs by electrically conductive connections between the metallic contacting layer and the semiconductor substrate at the high-contacting areas such that a further reduction of the overall recombination at the contacting side as well as the overall contacting resistance at the contacting side occurs, as described above. Additionally, the advantage develops that the cooperation of the reflective layer and the metallic contacting layer leads to an increased reflection at the contacting side, at least in the wavelength range between 800 nm and 1200 nm, such that particularly in this wavelength range electromagnetic radiation is reflected back into the semiconductor substrate and this way additionally the light yield of the solar cell and thus the effectiveness is further increased.

The method according to the invention further provides the advantages that no photo-lithographic steps are necessary and industrially implemented methods of prior art can be used for performing the method according to the invention.

The application of the above-mentioned layers may occur comprehensively so that particularly no cost-effective masking steps are necessary. Furthermore, the generation of the above-mentioned layers by methods of prior art are possible, particularly CVD (Chemical Vapor Deposition), such as PECVD (Plasma Enhanced Chemical Vapor Deposition) or by PVD (Physical Vapor Deposition) such as for example by way of sputtering, for which devices and process parameters for industrial implementation already exist.

In particular, the local heating of the layer structure provides a cost-effective and easily implemented industrial processing step to produce local high-doping.

It is already known to produce local contacting by way of local heating using lasers. Such a method is described, for example, in DE 100 46 170 A1 and in E. Schneiderlöchner, R. Preu, R. Lüdemann, and S. W. Glunz, "Laser-fired rear contacts for crystalline silicon solar cells," Progress in Photovoltaics: Research and Applications, vol. 10, pp. 29-34, 2002, and S. W. Glunz, E. Schneiderlöchner, D. Kray, A. Grohe, H. Kampwerth, R. Preu, and G. Willeke, "Laser-fired contact solar cells on p- and n-type substrates," in Proceedings of the 19$^{th}$ European Photovoltaic Solar Energy Conference (Paris, France), pp. 408-411, 2004. The method described here can be used for the production of local high-doping areas in the processing step B of the method according to the invention, so that here, too, established industrially applied methods can be utilized. Contrary to the above-mentioned methods for the production of local contacting, in the method according to the invention said contacting does not occur by way of local heating, though. In the processing step B only the local high-doping is created by locally generating a molten mixture from the layer of the layered structure and a partial area of the semiconductor substrate.

Subsequently in a processing step C the contacting occurs such that preferably over the entire surface the metallic contacting layer is applied onto the layer structure, with here the electrically conductive connection forms at the high-doping areas between the semiconductor substrate and the contacting layer.

Another reduction of the overall recombination at the contacting side is yielded in a preferred embodiment of the method according to the invention such that in the processing step A the layer structure additionally comprises an amorphous passivation layer with a silicon content of at least 90 at %. The passivation layer includes no doping material of the base doping type or only in a negligibly low concentration of less than $1 \times 10^{19}$ cm$^{-3}$ of such a doping substance. Furthermore, the passivation layer in the layer sequence is positioned closer to the contacting side than the doping layer. Preferably the passivation layer is applied immediately and/or comprehensively on the contacting side of the semiconductor substrate.

This way, a particularly efficient passivation of the contacting side and thus a particularly high electric quality of the semiconductor substrate is yielded at the contacting side, so that another increase in efficiency is yielded. In this preferred embodiment essentially the low surface recombination velocity is ensured at the contacting side of the semiconductor substrate by the isolation layer, the production of the local high-doping areas is allowed by the doping layer in the processing step B, and the optic quality of the contacting side is increased by the reflective layer particularly in the wavelength range between 800 nm and 1200 nm.

Another advantage of the method according to the invention is the fact that all layers applied in the processing step A may remain on the solar cell and thus it is not necessary for them to be removed again in technically expensive processing step and perhaps causing contamination or faulty sections in the semiconductor substrate. This way the costs of the production method are further reduced and simultaneously error sources are avoided, which might compromise the effectiveness of the solar cell.

Experiments of the applicant have shown that the passivation layer exhibits a thickness preferably from 5 nm to 100 nm, preferably from 30 nm to 50 nm. This way an optimization is yielded between the required overall processing time to apply the layer structure, on the one hand, and the passivation effect, on the other hand.

In particular the passivation layer is preferably embodied as a silicon carbide layer (SiC$_x$), preferably showing a carbon dioxide content of less than 10 at %. This way a very good passivation effect is yielded.

Furthermore, experiments of the applicant have shown that the doping layer preferably exhibits a thickness from 10 nm to 100 nm, preferably from 30 nm to 50 nm. This too leads to an optimization between the doping effect when producing the local high-doping areas and a low processing duration for the production of the layer structure. Preferably the doping layer comprises a doping material in a concentration exceeding $1 \times 10^{20}$ cm$^{-3}$.

The primary function of the doping layer is to provide the doping substance for doping the high-doping areas. For the doping process it is advantageous that during the melting process a liquid-liquid diffusion occurs between the molten partial areas of the doping layer and the semiconductor substrate because this way a particularly quick and efficient doping of the molten partial areas of the semiconductor substrate occurs. For this purpose, particularly a low melting point of the doping layer is advantageous, preferably the doping layer exhibits approximately the (same) melting point as the semiconductor substrate.

The addition of carbon to the doping layer increases the melting point. Accordingly it is advantageous for achieving the liquid-liquid diffusion that the doping layer exhibits no carbon content. A doping layer without any carbon shows the disadvantage, though, to be instable when heated to approximately 400° C. Processing steps with such temperatures are frequently used however after the application of the contacting layer in order to improve the contact features (so-called "tempering step").

Preferably the doping layer exhibits therefore a low carbon content so that, on the one hand, the melting point of the doping layer is increased only slightly and thus, as described above, a liquid-liquid diffusion is ensured and simultaneously the doping layer is resistant to heating to 400° C., particularly in tempering steps.

The doping layer is therefore preferably embodied as a silicon carbide layer containing carbon, with particularly the carbon content ranging from 0 at % to 10 at %, in particular preferably from 2 at % to 10 at %.

The reflective layer is preferably embodied as an amorphous, silicon comprising layer, such as for example silicon oxide or silicon nitride. This has the advantage that such a layer can be produced with simple technology. Additionally the embodiment of the reflective layer as an aluminum oxide layer or a titanium dioxide layer or a magnesium fluoride layer is included in the scope of the invention.

Furthermore, experiments of the applicant have shown that the reflective layer preferably exhibits a thickness from 50 nm to 300 nm, preferably from 100 nm to 300 nm. This leads to an optimization by increasing the optic quality, on the one hand, and a reduction of the overall processing duration when producing the layer system, on the other hand.

In particular the reflective layer is preferably embodied as a silicon carbide layer. Preferably the reflective layer exhibits a carbon content of more than 40 at %, particularly more than 50 at %. The carbon content of the reflective layer is an essential parameter with regards to the resulting diffraction index of the reflective layer. By the above-mentioned advantageous carbon content a diffraction index of less than 2.5 is yielded in the wavelength range from 800 nm to 1200 nm, so that a lower diffraction index is yielded compared to the diffraction index of (carbon-free) silicon in this wavelength range and the increase of the optic quality is ensured at the contacting side of the semiconductor substrate.

Preferably, at least in the wavelength range from 800 nm and 1200 nm, the reflective layer exhibits a diffraction index $n_R$ of less than 2.5 and more than 1 to yield the above-mentioned optic quality.

In order to yield an optimal electric quality, particularly with regards to the surface recombination velocity at the contacting side of the semiconductor substrate, preferably prior to the processing step A a cleaning is performed at least at the contacting side of the semiconductor substrate so that potential contaminants or minor crystalline anomalies are removed. In particular wet-chemical cleaning is suitable, here.

Preferably, in the method according to the invention all layers are produced in one processing step A via low-temperature methods at temperatures of less than 300° C. This way, the method according to the invention can also be used for solar cell structures comprising hetero-structures on the side of the semiconductor substrate opposite the contacting side, for example. Processing steps above the limit temperature mentioned may damage hetero-structures. The application of the above-mentioned layers to produce the layer system in the processing step A is possible with the above-mentioned methods, particularly via PECVD at temperatures of less than the above-mentioned limit temperature. The method according to the invention is therefore particularly suitable for producing high-efficient silicon solar cells, which show a so-called hetero-emitter, i.e. an emitter formed by applying a doping layer, which exhibits a doping type opposite the base doping type.

Additionally, the method according to the invention can also be used in solar cell structures showing one or more emitters generated by way of diffusion in the semiconductor substrate.

The production of the layer structure in the processing step A occurs preferably by PECVD, because here existing facilities for the industrial use and existing processing parameters for creating these layers can be utilized. Preferably here the generation of the doping layer or other layers comprising the doping substance occurs by adding a doping gas during the precipitation process, in particular preferably by adding phosphine gas.

The local heating in the processing step B occurs preferably by a laser and is preferably embodied particularly according to DE 100 46 170 A1 and E. Schneiderlöchner, R. Preu, R. Lüdemann, and S. W. Glunz, "Laser-fired rear contacts for crystalline silicon solar cells," Progress in Photovoltaics: Research and applications, vol. 10, pp. 29-34, 2002 and S. W. Glunz, E. Schneiderlöchner, D. Kray, A. Grohe, H. Kampwerth, R. Preu, and G. Willeke, "Laser-fired contact solar cells on p- and n-type substrates," in Proceedings of the 19th European Photovoltaic Solar Energy Conference (Paris, France), pp. 408-411, 2004.

Preferably the heating occurs by a pulsed laser, because this way sufficient heating to yield the molten mixture can be achieved. The wavelength of the laser is preferably below 1200 nm, because at greater wavelengths the absorption into silicon reduces considerably and no melting would occur, but at best an ablation of the layers.

In particular the application of a laser is advantageous, which is deflected via a mirror system successively to different points of the contacting side in order to create the high-doping areas. Here, existing devices with Piezo-deflection mirrors can be used, so that within a short processing period a multitude of high-doping areas can be produced at the contacting side.

The method according to the invention can be applied, in principle, at the front and/or the rear of a solar cell and/or a precursor of a solar cell. When the method is applied at the front of a solar cell the metallic layer is applied such that it covers the front only partially, at least in the high-doping areas, so that at the sections not covered by the metallic layer electromagnetic radiation can penetrate into the semiconductor substrate. The application of the method according to the invention is particularly advantageous at the rear of a solar cell and/or a precursor of a solar cell. In particular, the optic quality of the above-mentioned wavelength range is essential at the rear, because in this wavelength range silicon exhibits low absorption compared to direct semiconductors, and thus a considerable portion of electromagnetic radiation in this wavelength range can pass through the semiconductor substrate and thus an increase of the overall absorption can be achieved by the reflection of the radiation in said wavelength range by the cooperation of the reflective layer and the metallic layer.

Preferably the contact side is therefore the rear side, facing away from the irradiation of electromagnetic radiation during the operation of the solar cell.

The method according to the invention can generally be used both for solar cells with n-base doping as well as solar cells with p-base doping. In particular, silicon solar cells with n-base doping show a great potential in industrial production. The n-doped silicon exhibits inherent advantages compared to the p-doped silicon with regards to material features: It exhibits no degradation effect connected to the formation of doping-oxygen complexes. The life expectancy of the minority charge carriers is therefore higher both in the floating-zone silicon as well as the Czrochalsky-silicon compared to p-doped silicon. Furthermore, the tolerance of n-doped silicon for contaminants, such as iron, is higher with regards to its life span compared to p-doped silicon. Furthermore, n-doped silicon is characterized in an increased conductivity at identical concentrations of doping substance, which particularly increases the effectiveness of high-doping areas of n-doping in reference to high-doping areas of p-doping. Accordingly, the maximum effectiveness in the solar cell production is presently yielded based on solar cells with n-base doping.

Accordingly, the method according to the invention is preferably applied with an n-base doping.

As explained above, the reflective layer fulfills primarily the function in cooperation with the metallization layer to cause a reflection at least in the infrared range (from 800 nm to 1200 nm). Preferably the reflective layer also exhibits a doping substance in a concentration of more than $10^{20}$ cm$^{-3}$. This achieves the advantage that during the melting when the doping substance is diffused from the doping layer no segregation of the doping substance occurs in the reflective layer or only to a small extent, and thus the doping substance of the doping layer essentially diffuses into the high-doping area.

The doping layer and perhaps the passivation layer are embodied as amorphous, silicon containing layers. On the one hand, such amorphous layers show good electric passivation features with regards to the surface recombination of the adjacent contacting side of the semiconductor substrate. The passivation effect improves with increasing layer thickness. However, layers comprising amorphous silicon show considerably lower electric conductivity in reference to crystalline silicon so that the electric resistance for current flow perpendicularly in reference to the contact surface increases with growing layer thickness. However, in the method according to the invention this is not disadvantageous because the removal of charge carriers to the contacting layer occurs essentially via the high-doping areas and the contact points following here. In the method according to the invention therefore an optimization of the layer thickness can occur with regards to the passivation effect, without here disadvantages developing by an increased electric resistivity. Preferably the doping and/or the passivation layer therefore show a thickness of at least 30 nm, particularly at least 50 nm; because layers of amorphous silicon with such minimum thicknesses show a very good electric passivation feature.

BRIEF DESCRIPTION OF THE DRAWINGS

Additional preferred features and embodiments of the method according to the invention are explained in the following based on the figures and an exemplary embodiment. Here shown are.

DETAILED DESCRIPTION OF THE PREFERRED EMBODIMENTS

Figure 1:
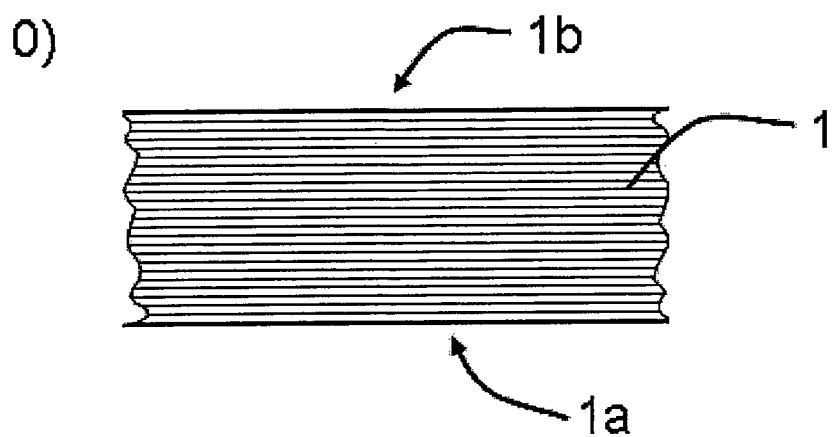
FIG. 1 processing steps 0 and A of an exemplary embodiment of the method according to the invention for a local high-doping and contacting of the rear of a silicon wafer, and FIG. 2 processing steps B and C of the exemplary embodiment.
Figure 1:
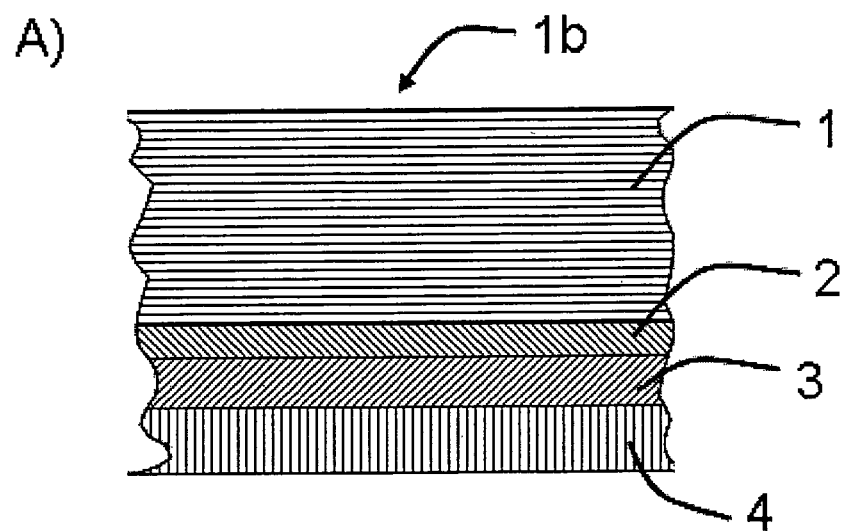
Figure 2:
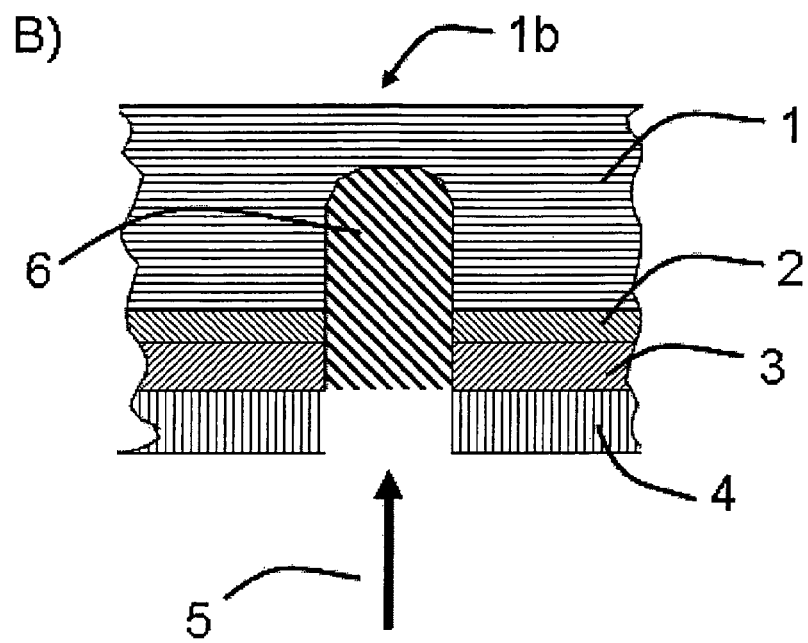
Figure 2:
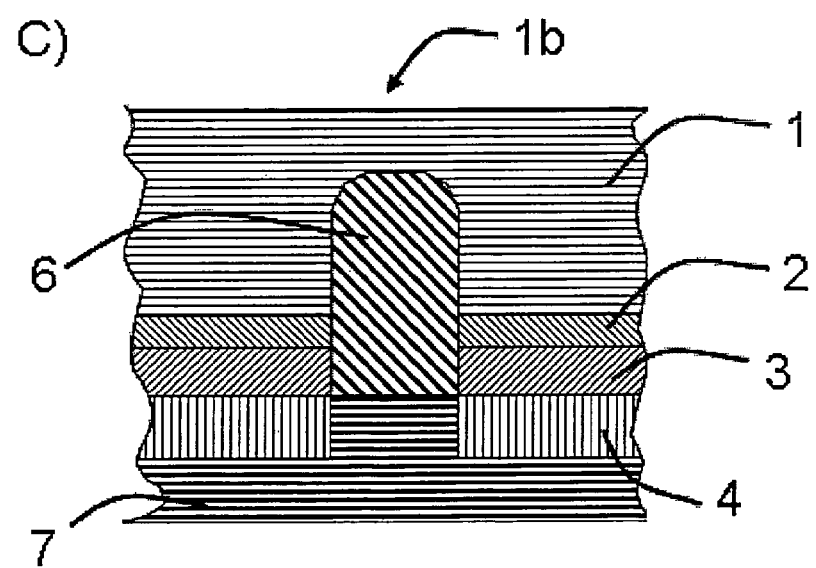

FIGS. 1 and 2 show an exemplary embodiment of a method according to the invention for a local high-doping and contacting of a semiconductor structure, which represents a precursor of a silicon solar cell. In all figures identical reference characters mark identical elements.

The semiconductor structure 1 embodied as a silicon wafer comprises a homogenous n-doping with a concentration of the doping substance amounting to $5\times10^{15}$ cm$^{-3}$. The solar cell to be produced is therefore a n-type silicon solar cell.

In all schematic illustrations shown in the figures only a section of the semiconductor structure is shown, the semiconductor structure continues at the right and the left, respectively. For better visibility the schematic illustration is not shown true to scale, particularly with regards to the ratio of height to width.

The semiconductor substrate 1 comprises a contacting side 1a, which represents the rear of the semiconductor substrate. During the operation of the finished solar cell an impingement of the semiconductor substrate 1 occurs with electromagnetic radiation via the contacting side 1a of the opposite front 1b.

In a processing step 0, first a cleaning of the contacting side 1a occurs. This is performed via a RCA-cleaning, known per se, as described in W. Kern, D. Puotinen: Cleaning Solutions Based on Hydrogen Peroxide for Use in Silicon Semiconductor Technology. In: RCA Review 187 (June 1970) and preferably comprises the following steps:

Cleaning with ammonium hydroxide, hydrogen peroxide, DI-water, at a ratio from 1:1:5 to 1:2:7, then Cleaning with hydrochloric acid, hydrogen peroxide, DI-water, at a ratio from 1:1:6 to 1:2:8.

Subsequently the precipitation of a layer structure occurs in a processing step A.

The layer structure comprises a passivation layer 2, a doping layer 3, and a reflective layer 4.

All three layers are precipitated via PECVD and embodied as amorphous silicon carbide layers. The layers particularly differ with regards to their content of carbon and doping substance.

First, the passivation layer 2 is precipitated as an amorphous silicon carbide layer using PECVD. The layer thickness preferably ranges from 5 nm to 50 nm, in the exemplary embodiment shown here the layer thickness amounts to 20 nm. The passivation layer 2 is an intrinsic layer, i.e. it exhibits no doping substance of the base doping type (in this case no n-doping substance). Furthermore, the passivation layer is embodied as a silicon-rich layer and exhibits a silicon content of more than 90 at %. The scope of the invention includes that no carbon is contained in the passivation layer; in the exemplary embodiment shown here the doping layer is embodied with a silicon content of 95 at %.

The passivation layer 2 leads to a saturation of the surface defects of the contacting side 1a of the semiconductor substrate 1, so that an efficient reduction of the surface recombination velocity at the contacting side is yielded and thus a high electric quality with regards to the recombination features is given at the contacting side 1a of the semiconductor substrate 1.

Subsequently the doping layer 3 is precipitated. The doping layer 3 is also embodied as a silicon-rich amorphous silicon carbide layer and exhibits a silicon content of more than 90 at %. Here, too, the scope of the invention includes that the doping layer 3 exhibits no carbon content. In the present exemplary embodiment the silicon content of the doping layer amounts to 95 at %.

The doping layer 3 exhibits a high doping of the doping substance of the base doping type, preferably a concentration of the doping substance exceeding $10^{20}$ cm$^{-3}$. In the present exemplary embodiment the doping layer 3 is enriched with phosphorus at a concentration of $8\times10^{20}$ cm$^{-3}$. The doping is yielded such that during the precipitation via PECVD a doping gas, in the present exemplary embodiment phosphine, is added to the precursor gases during the precipitation process.

On the one hand, the doping layer 3 serves as a source for the doping substance to form the locally high-doped areas in the subsequent processing steps. On the other hand, in combination with the passivation layer 2 the doping layer 3 increases the electric quality of the contacting side 1a of the semiconductor substrate 1 by reducing the recombination velocity at the contacting side.

It is particularly necessary that the doping layer 3 is embodied as a silicon-rich layer with a silicon content exceeding 90 at %, because a silicon-rich layer exhibits a lower melting temperature compared to a layer with a higher carbon content and thus a lower silicon portion. By embodying particularly the doping layer 3 and additionally the passivation layer 2 as a silicon-rich layer, a local melting occurs during the local heating described in the following, both of the silicon as well as the silicon-rich layers located thereabove such that a liquid-liquid diffusion of the doping substance occurs, particularly from the doping layer 3, and thus a rapid diffusion and accordingly an embodiment of the high-doping area is ensured insusceptible to flaws. Preferably here the doping layer and/or the passivation layer are formed with a carbon content of less than 10 at %, particularly preferred the two layers show a carbon content of less than 10 at %.

The doping layer 3 preferably comprises a layer thickness from 10 nm to 100 nm. In the present exemplary embodiment the thickness of the doping layer amounts to 50 nm.

Subsequently the reflective layer 4 is precipitated. The reflective layer 4 is also precipitated as an amorphous silicon-carbide layer and preferably exhibits a layer thickness from 50 nm to 300 nm. In the present exemplary embodiment the layer thickness of the reflective layer amounts to 100 nm. Contrary to the doping layer 3 and the passivation layer 2, in the reflective layer 4 the carbon content is selected higher. Accordingly the reflective layer 4 preferably comprises a silicon portion of less than 40 at %, particularly preferred less than 50 at %. In the present exemplary embodiment the silicon content of the reflective layer amounts to approximately 40 at % and the carbon content of the reflective layer approximately 60 at %. The background is here that the optic diffraction index of the reflective layer is essentially determined by the carbon content and that for the reflective layer 4 a diffraction index $n_R$ is beneficially smaller than the diffraction index of the semiconductor substrate 1, particularly below 2.5, in order to yield high optic quality of the rear, particularly in the wavelength range from 800 nm to 1200 nm.

In the present exemplary embodiment a diffraction index $n_R$ is yielded ranging from 1.8 to 2.3

In cooperation with a subsequent contacting layer the primary function of the reflective layer 4 is to improve the reflective features in the infrared range, particularly in the wavelength range from 800 nm to 1200 nm so that electromagnetic radiation in this wavelength range is reflected and this way the optic light yield in the semiconductor substrate 1 and thus the effectiveness of the solar cell is increased.

Preferably the reflective layer 4 additionally comprises the doping substance of the basic doping type, so that the serves as an additional source of the doping substance to form the high-doping area and/or counteracts a segregation of the doping substance from the doping layer into the reflective layer. In the present exemplary embodiment, by way of adding phosphine gas, as described above, during the precipitation of the reflective layer 4 a phosphorus concentration is yielded in the reflective layer 4 amounting to approximately $5\times10^{20}$ cm$^{-3}$.

FIG. 1A shows the semiconductor substrate 1 with the layer structure produced in the processing step A.

Subsequently, in a processing step B, a local heating occurs of the layer structure as well as the surface of the semiconductor substrate located thereunder at several zones in order to form local high-doping areas. FIG. 2 shows in the sub-figures B and C one such high-doping area 6 each.

The formation of the high-doping area occurs by a local heating using a laser, with the laser preferably being embodied as a pulsed laser. FIG. 2B schematically shows a laser pulse 5.

The local heating via the laser leads to a local melting of the passivation layer 2, the doping layer 3, as well as sections of the semiconductor substrate 1 at the contacting side 1a. The reflective layer, carbon-rich in reference to the other layers, is ablated due to the higher melting point by this local heating.

In the molten mixture the doping substance separates from the doping layer 3 and in the present exemplary embodiment also from the reflective layer 4 and dissolves in the molten mixture so that after the molten mixture has set a high-doping area 6 is given, as shown in FIGS. 2B and 2C. By the brief local heating process also a slight material removal occurs, so that approximately the set molten mixture exhibits a recessed surface in reference to the reflective layer 4 surrounding the set molten mixture, as shown in FIG. 2B.

In the processing step B, here a local high-doping 6 is generated at the contacting side 1a of the semiconductor substrate 1 so that a contacting of the semiconductor substrate is possible in which, on the one side, due to the high-doping, a low contact resistance is ensured and, on the other side, the recombination features, particularly at the contacting area, i.e. particularly in the high-doping area, are improved compared to a contacting without any high-doping area. As a result, here another increase of the overall effectiveness of the solar cell develops.

In the processing step C subsequently a metallic contacting layer 7 is applied. This preferably occurs by a comprehensive application of a metallic layer on the lowermost layer of the layer structure, in the present exemplary embodiment the reflective layer 4. Here, an electrically conductive contact develops between the contacting layer 7 and the high-doping area 6.

The application of the contacting layer 7 can occur in a manner known per se, for example by way of vapor deposition of the contacting layer. Additionally, the scope of the invention also includes using the above-mentioned methods of galvanization for rear contacting in silicon solar cells, particularly to embody the contacting layer from aluminum. Additionally the formation of the contacting layer 7 as a layer system comprising several layers of different materials is included in the scope of the invention.

In the present exemplary embodiment the contacting layer 7 is embodied as an aluminum layer and applied by way of vapor deposition.

Preferably, in a subsequent sintering step, i.e. a heated step at a temperature from 300° C. to 450° C., the formation of the electric contact is improved between the contacting layer 7 and the semiconductor substrate 1 at the high-doping area 6.

The application of the passivation layer 2, the doping layer 3, and the reflective layer 4 occurs, as explained above, via PECVD in a vacuum environment and in a manner known per se. The application of layers using PECVD it is known to one trained in the art and described, for example, in "Principles of plasma discharges and materials processing", M. A. Lieberman, A. J. Lichtenberg, John Wiley & Sons, Inc.

The local heating in the processing step B via the laser occurs preferably, as described above, in the above-mentioned method for the formation of the punctual contacts via local heating using a laser. In particular, light pulses of a laser are suitable with a pulse term ranging from 1 ns to 5 µs for the method according to the invention, in order to keep the thermal stress of the adjacent material layers as low as possible, but simultaneously maintain the thermal impact long enough to ensure the melting of the layer system and the silicon from a depth of approx. 100 nm to a few µm, preferably depths from 0.1 µm to 10 µm. Wavelengths ranging from 200 to 1200 nm are suitable as process wavelength, here. Preferably a pulsed solid-substance laser (e.g., Nd: YAG-laser, Yb: YAG-laser, a fiber-laser or fiber-amplifier) is used as the laser, here, with its laser beam being deflected via deflection mirrors to the respective points in order to generate high-doping areas. This way, in a sequential progression, a plurality of high-doping areas can be produced in a short period of time because only a very short impact term of the laser is required to a point in order to generate a high-doping area.

As described above, the method according to the invention can be used in solar cells with diffused emitters as well as in solar cells with emitters generated by hetero-structures, i.e. emitters created by applying layers with a doping opposite the doping of the semiconductor substrate.

Due to the fact that all steps of the method according to the invention represent low-temperature steps and thus no global heating of the semiconductor structure occurs to temperatures exceeding 450° C. (if applicable except for the local heating at the high-doping areas) the method according to the invention can be implemented without any problems in methods of prior art for the production of a solar cell. Preferably the production of the emitter occurs prior to the execution of the processing steps A, B, and C.

The invention claimed is:

1. A method for local high-doping and contacting of a semiconductor structure, representing a solar cell or a precursor of a solar cell and comprising a silicon-semiconductor substrate (1) of a base doping type, with high-doping and contacting occurring by generating several local high-doping areas of the base doping type in the semiconductor substrate (1) at a contacting side (1a) of the semiconductor substrate and applying a metallic contacting layer (7) on the contacting side (1a) or one or more intermediate layers covering the contacting side (1a) partially or entirely, in order to form electrically conductive connections between the metallic contacting layer (7) and the semiconductor substrate (1) at the high-doping areas, the method comprises the following steps:

A generating a layer structure covering the contacting side (1a) of the semiconductor substrate, comprising
a doping layer (3), which comprises a doping substance of the base doping type and is embodied as a layer of amorphous silicon or a layer of amorphous silicon carbide with a carbon content of less than 10 at %, and a reflective layer (4), which is embodied at least in a wavelength range from 800 nm to 1200 nm with a diffraction index $n_R$ lower than a diffraction index $n_{HS}$ of the semiconductor substrate,
with the doping layer (3) formed in the layer sequence located closer to the contacting side (1a) than the reflective layer (4), B locally heating the layer structure and a surface of the semiconductor substrate located thereunder at several zones to form local high-doping areas, with the local heating here occurring such that at the locally heated high-doping areas locally a molten mixture develops respectively comprising at least the doping layer (3) and a section of the semiconductor substrate at the contacting side (1a) and, when the molten mixture sets, a stronger doped area (6) forms in the semiconductor substrate (1) at the contacting side (1a) by at least the doping substance of the doping layer (3), and C applying the metallic contacting layer (7) to form the electrically conductive connection between the semiconductor substrate (1) and the contacting layer (7) at the high-doping areas.

2. A method according to claim 1, wherein in the processing step A the layer structure is formed with one additionally amorphous passivation layer (2) exhibiting a silicon content of at least 90 at %, with the passivation layer (2) comprising no doping substance of the base doping type or only a concentration of less than $1 \times 10^{19}$ cm$^{-3}$ of said doping substance, and the passivation layer (2) is embodied in the layer sequence located closer to the contacting side (1a) than the doping layer (3).

3. A method according to claim 2, wherein the passivation layer (2) is formed with a thickness from 5 nm to 100 nm.

4. A method according to claim 3, wherein the passivation layer (2) is embodied as a silicon-carbide layer comprising carbon with a carbon content from 1 at % to 10 at %.

5. A method according to claim 1, wherein the doping layer (3) is embodied with a thickness from 10 nm to 100 nm.

6. A method according to claim 1, wherein the doping layer (3) is embodied as a silicon-carbide layer comprising carbon with a carbon content from 1 at % to 10 at %.

7. A method according to claim 1, wherein the reflective layer (4) is embodied with a thickness from 50 nm to 300 nm.

8. A method according to claim 1, wherein the reflective layer (4) is embodied as a silicon-carbide layer comprising carbon with a carbon content exceeding 40 at %.

9. A method according to claim 1, wherein the reflective layer (4) is embodied at least in the wavelength range from 800 nm to 1200 nm with a diffraction index $n_R$ of less than 2.5 and greater than 1.

10. A method according to claim 1, wherein a cleaning occurs of at least the contacting side (1a) of the semiconductor substrate prior to the processing step A.

11. A method according to claim 1, wherein in the processing step A all layers are generated by way of low-temperature processing at a temperature of less than 300° C.

12. A method according to claim 1, wherein in the processing step A the layer structure is generated by PECVD (Plasma Enhanced Chemical Vapor Deposition).

13. A method according to claim 12, wherein in the processing step A one or more layers are created comprising doping substance by adding a doping gas during a precipitation process.

14. A method according to claim 1, wherein in the processing step B the local heating occurs by way of a laser.

15. A method according to claim 1, wherein the contacting side (1a) is a rear side facing away from incident electromagnetic radiation during operation of the solar cell.

* * * * *